United States Patent [19]

Mori et al.

[11] Patent Number: 5,244,073

[45] Date of Patent: Sep. 14, 1993

[54] METHOD OF PRESSING CHIP TYPE ELECTRONIC COMPONENTS

[75] Inventors: Naoyuki Mori; Hidemasa Iwami; Shigeo Hayashi; Nobuyuki Hayashi; Toru Matsumura; Mitsuro Hamuro; Hirokazu Higuchi; Akihiko Takahashi, all of Kyoto, Japan

[73] Assignee: Murata Manufacturing Co., Ltd., Japan

[21] Appl. No.: 861,308

[22] Filed: Mar. 31, 1992

[30] Foreign Application Priority Data

Dec. 3, 1991 [JP] Japan .................................. 3-347939
Feb. 28, 1992 [JP] Japan .................................. 4-78979

[51] Int. Cl.$^5$ ............................................ B65G 37/00
[52] U.S. Cl. ............................ 198/346.1; 198/468.8; 198/468.9; 198/418.6; 29/759
[58] Field of Search ............... 198/418.6, 468.8, 468.9, 198/346.1; 414/799; 29/760, 759

[56] References Cited

U.S. PATENT DOCUMENTS

| | | | |
|---|---|---|---|
| 4,395,184 | 7/1983 | Braden | 414/17 |
| 4,664,943 | 5/1987 | Nitta et al. | 118/500 X |
| 4,847,991 | 7/1989 | Higuchi | 29/759 |
| 4,953,283 | 9/1990 | Kawabata et al. | 29/759 X |

FOREIGN PATENT DOCUMENTS 3532858 9/1986 Fed. Rep. of Germany .

Primary Examiner—Robert P. Olszewski
Assistant Examiner—Cheryl L. Gastineau
Attorney, Agent, or Firm—Ostrolenk, Faber, Gerb & Soffen

[57] ABSTRACT

A press machine comprises a holding plate provided with a number of receiving holes at constant arrangement pitches and a pin head having a number of press pins at the same arrangement pitches as the receiving holes. A portion provided with the receiving holes is in the form of a square, while a portion provided with the press pins is also in the form of a square, which has a width identical to that of the portion provided with the receiving holes and a depth half that of the portion provided with the receiving holes. The holding plate is placed on a movable table, which in turn is moved to a first working position to insert a first group of chip type electronic components into the receiving holes provided in a first half region of the holding plate by the press pins, and then moved to a second working position to press a second group of chip type electronic components into the receiving holes provided in a second half region of the holding plate by the press pins. Thus, it is possible to reduce a load applied to the holding plate as well as reactive force applied to the pin head in each pressing operation, while the pin head can be applied to various sizes of holding plates in common.

8 Claims, 6 Drawing Sheets

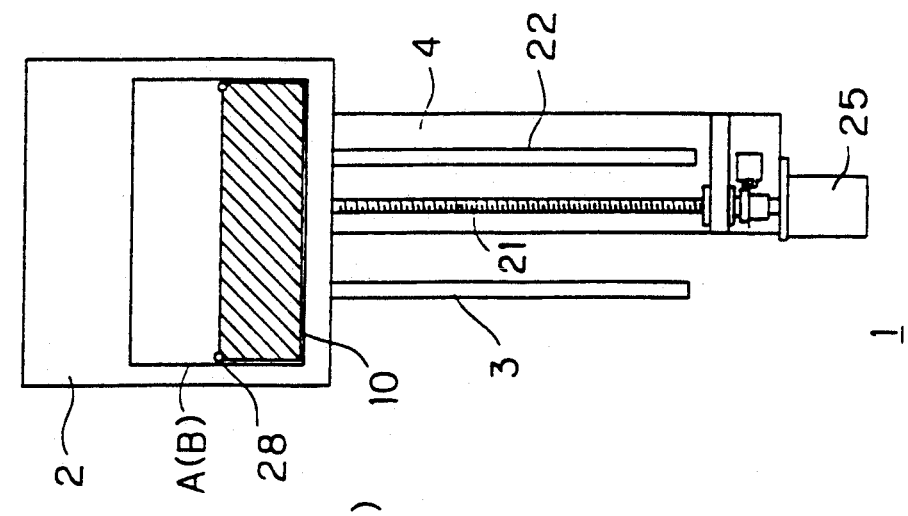
FIG. 3A SET POSITION
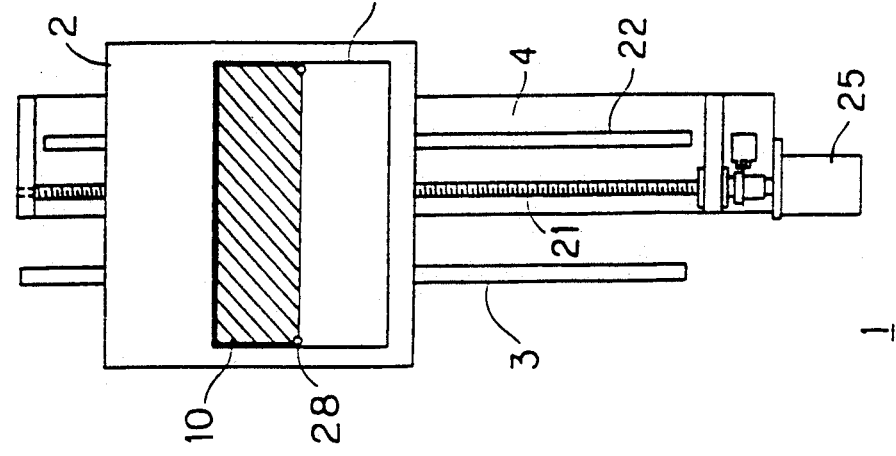
FIG. 3B FIRST WORKING POSITION
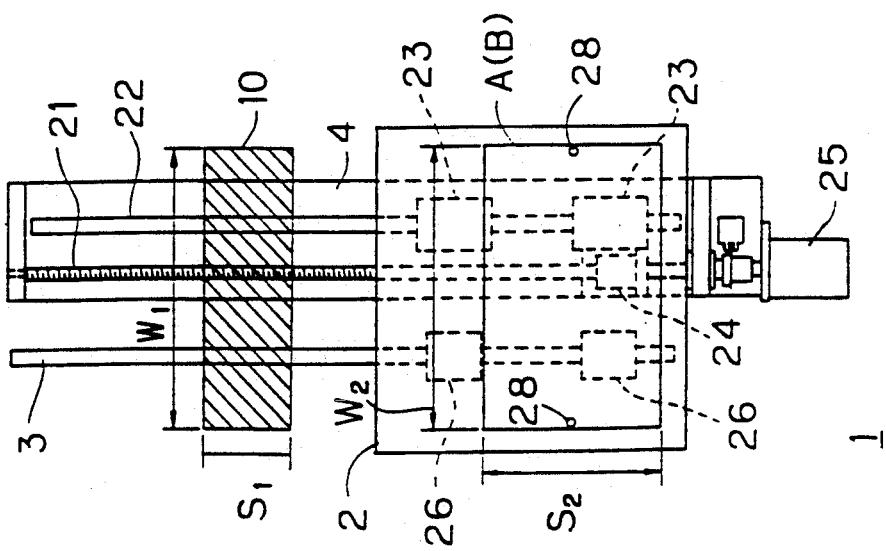
FIG. 3C SECOND WORKING POSITION

METHOD OF PRESSING CHIP TYPE ELECTRONIC COMPONENTS

BACKGROUND OF THE INVENTION

Field of the Invention

The present invention relates to a method of pressing chip type electronic components for carrying out at least one of the following operation inserting chip type electronic components such as chip capacitors or chip resistors into receiving holes of a holding plate; transferring chip type electronic components from a in which plate holding such chip type electronic components are being held, to another holding plate; or pressing out chip type electronic components from receiving holes of a holding plate.

Description of the Background Art

In general, a holding plate elastically holding a number of chip type electronic components is employed for simultaneously applying electrodes onto end portions of the chip type electronic components, as described in U.S. Pat. No. 4,395,184. This holding plate comprises a hard substrate, a thin flat plate portion formed at a central portion of the hard substrate and provided with a number of through holes, and a rubber-like elastic member which is embedded, in a concave portion defined in the flat portion and provided with receiving holes, passing through the elastic member, in portions corresponding to the through holes. This holding plate is adapted to be used to form external electrodes on both ends of chip type electronic components by a method disclosed in U.S. Pat. No. 4,664,943, for example.

First, a guide plate, which is provided with a plurality of through holes in correspondence to the receiving holes of the holding plate, is placed on the surface of the holding plate. Then chip type electronic components are inserted one by one into the through holes of the guide plate by an introducer. Then, the chip type electronic components received in the through holes are downwardly pressed by a number of press pins so as to be received in the receiving holes, so that the holding plate elastically holds the chip type electronic components with upper end portions thereof exposed on its surface. The holding plate thus holding the chip type electronic components is then turned over and the downwardly exposed portions of the chip type electronic components are pressed against an electrode coating plate which is coated with electrode paste of silver or the like, so that electrodes are applied to the exposed end portions of the chip type electronic components. Then the electrodes applied to the chip type electronic components are dried, and thereafter a second holding plate is arranged under the first holding plate holding the chip type electronic components and spaced therefrom via a frame type spacer of a prescribed thickness. Then the chip type electronic components are transferred from the first holding plate to the second one by press pins which are similar to the above, so that the other end portions, provided with no electrodes, of the chip type electronic components are exposed. Thereafter electrode paste is applied to the other end portions of the chip type electronic components by an operation similar to the above, and then dried, so that electrodes are formed on both end portions of the chip type electronic components. Finally the holding plate holding the chip type electronic components, which are provided with the electrodes on both end portions, is placed on a recovery case, and the chip type electronic components are downwardly pressed out from the receiving holes by the press pins, to be collected in the recovery case.

In order to insert the chip type electronic components from the guide plate into the holding plate, or to press out the chip type electronic components from the holding plate into the recovery case or, to transfer the same from a holding plate to another one, a press machine having a number of press pins is employed. U.S. Pat. No. 4,395,184 discloses an example of such a press machine. This press machine comprises an upper plate which is vertically moved by a handle and a number of press pins which project downward from the upper plate. A mechanism for positioning a guide plate, a holding plate and a discharge plate in an overlapping relation is provided under the upper plate.

In order to improve high-volume production capability, a single holding plate is generally provided with thousands of receiving holes. However, such a holding plate is inferior in rigidity along the horizontal direction since the same is provided with a thin flat plate portion having a number of through holes in its center and a rubber-type elastic member embedded in the thin flat plate portion for partially covering the through holes. When chip type electronic components are simultaneously inserted or transferred into the thousands of receiving holes provided in such a holding plate, an extremely heavy load is applied which may the holding plate, to cause deformation or cracking. Thus, the life of the holding plate is reduced.

Further, when thousands of chip type electronic components are simultaneously pressed in a single operation, an extremely high reactive force is applied to a pin head holding the press pins. Thus, a strong thrust is required for pressing the pin head, leading to an increase in the necessary machine size. Additionally, such a machine vibrates more as the pressing frequency increases, and such vibration leads to a reduction in accuracy.

Further, in order to change the size of the holding plate, it is necessary to also change the pin head, which is selected in correspondence to the size of the holding plate. In other words, it is necessary to prepare a plurality of pin heads in correspondence to the types of holding plates, and an operation for exchanging the pin heads is complicated.

SUMMARY OF THE INVENTION

Accordingly, an object of the present invention is to provide a method of pressing chip type electronic components, which can reduce a load applied to a holding plate as well as reactive force applied to a pin head in a pressing operation.

Another object of the present invention is to provide a method of pressing chip type electronic components, which can apply a single pin head to a plurality of sizes of holding plates in common.

In order to attain the aforementioned objects, the present invention employs a press machine comprising a horizontally supported holding plate which is provided with a number of receiving holes arranged at constant pitch and a horizontally supported pin head having a number of press pins with the same arrangement and pitch as the receiving holes for carrying out at least one of several operations, namely, an operation for inserting chip type electronic components into receiving holes of a holding plate, an operation for transferring chip type electronic components from a holding plate holding such chip type electronic components to another one, and an operation for pressing out chip type electronic components from receiving holes of a holding plate. In such a press machine, a portion of the pin head provided with the press pins is made smaller than a portion of the holding plate provided with the receiving holes. The present invention is characterized in that such a press machine is so employed that the holding plate and the pin head are relatively moved by prescribed distances in the horizontal direction, then for each such horizontal motion, the holding plate on the pin head are relatively moved by a prescribed distance in the vertical direction, thereby pressing a single holding plate a plurality of times.

An exemplary operation for downwardly inserting chip type electronic components into receiving holes of a holding plate is now described.

First, a guide plate storing chip type electronic components in its through holes is placed on the upper surface of a holding plate, and these plates are integrally set on a support. Thereafter the holding plate and the guide plate are horizontally moved so that an end of a portion of the holding plate provided with receiving holes is located under a pin head. The pin head is downwardly moved to press a first group of the chip type electronic components with press pins, thereby inserting the same into a first group of the receiving holes of the holding plate. Then the pin head is upwardly moved and thereafter the holding plate and the guide plate are horizontally moved by a constant distance so that a region of the holding plate, which is adjacent to the end provided with the first group of the receiving holes receiving the first group of the chip type electronic components, is located under the pin head. Thereafter the pin head is again downwardly moved to insert a second group of the chip type electronic components into a second group of the receiving holes of the holding plate. Such an operation is so repeated as to insert the chip type electronic components into all receiving holes of the holding plate.

The portion of the holding plate provided with the receiving holes is not restricted to a rectangular form but may be in any arbitrary form such as a circular or elliptical form. When the portion provided with the receiving holes is in a rectangular form and the portion of the pin head provided with the press pins is also in a rectangular form having a width identical to that of the portion provided with the receiving holes and a depth smaller than that of the portion provided with the receiving holes, it is possible to press the chip type electronic components in relation to all receiving holes by simply relatively moving the holding plate or the pin head relatively along the depth. Thus, the horizontal movement can be unidirectionally limited to simplify a mechanism for such movement, while the receiving holes and the press pins can be preferably improved in positional accuracy.

When the portions provided with the receiving holes and the portion provided with the press pins are in rectangular forms having the same widths, the press pins may press the holding plate twice if the depth of the portion provided with the press pins is half that of the portion provided with the receiving holes, while the press pins may press the holding plate three times when the depth of the former is ⅓ that of the latter. If a single press pin can press a single receiving hole twice, the depth of the portion provided with the receiving holes need not be integral times that of the portion provided with the press pins.

As to the horizontal movement and the vertical movement of the holding plate and the pin head, either one or both of the holding plate and the pin head may be moved.

According to the present invention, the pin head having a portion provided with press pins, which portion is smaller than that of the holding plate provided with receiving holes, is adapted to carry out pressing operations in a divided manner, whereby only a small load is applied to the holding plate every pressing operation, to reduce deformation and cracking of the holding plate.

Further, it is also possible to reduce reactive force which is applied to the pin head, whereby a mechanism for driving the press pins can be reduced in size and a portion for supporting the holding plate and a mechanism for driving the same may not be much increased in rigidity.

In addition, the pin head can be applied to various sizes of holding plates in common so far as the holding plates have receiving holes at constant arrangement pitches.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a plan view showing respective working positions of a table moving mechanism included in the press machine;

DESCRIPTION OF THE PREFERRED EMBODIMENTS

Figure 1:
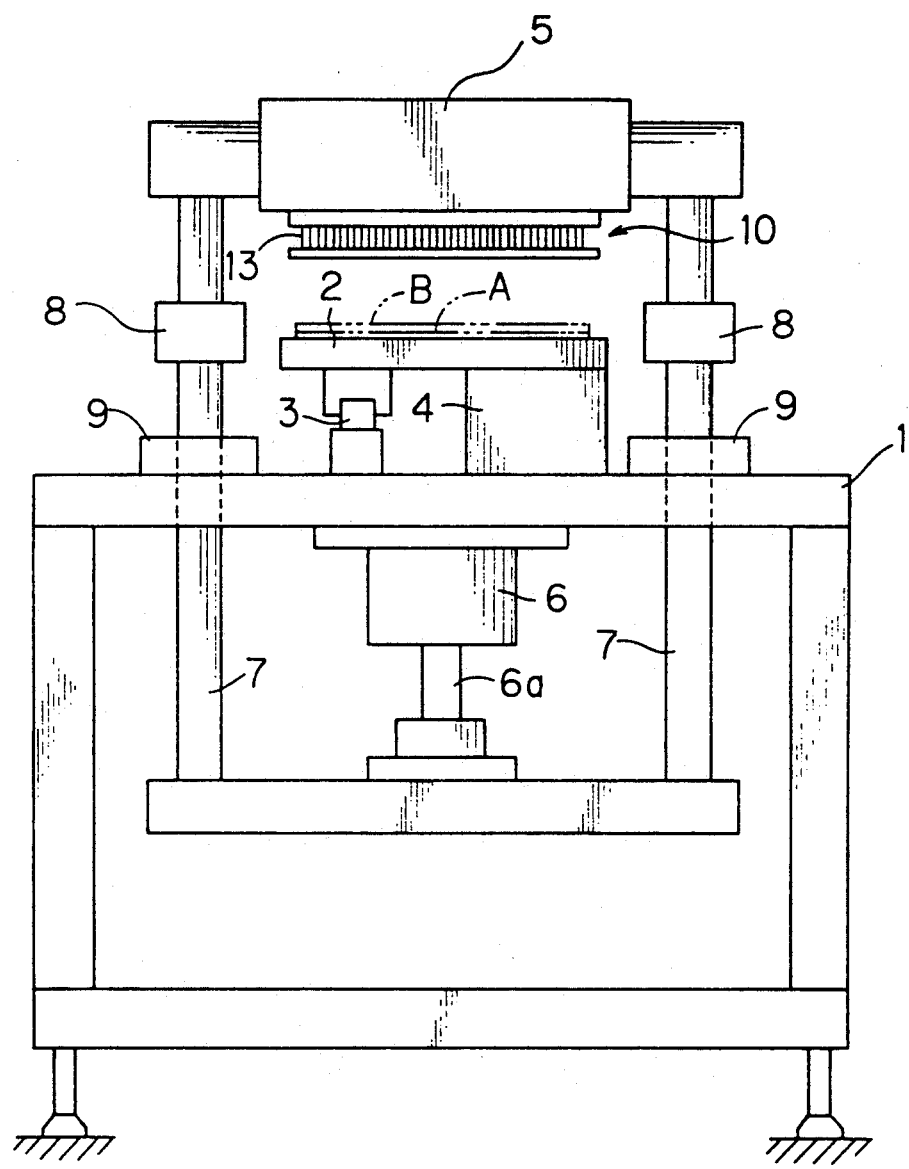
FIG. 1 is a front elevational view schematically showing a press machine according to a first embodiment of the present invention.

FIG. 1 shows a first embodiment of a press machine according to the present invention, which is applied to an operation for inserting chip type electronic components C into receiving holes $a_1$ of a holding plate A, an operation for transferring chip type electronic components from a holding plate holding the same to another one, or the like. The holding plate A is similar in structure to that disclosed in Japanese Patent Publication No. 3-44404 (1991).

The inventive press machine is formed by a press body 1 which is set in a horizontal position, a movable table 2 which is supported on the body 1 through a guide rail 3 to be movable in the horizontal direction (direction perpendicular to the plane of FIG. 1) and a uniaxial unit 4, a press head portion 5 which is vertically movably supported with respect to the body 1, and a vertical cylinder 6, serving as a press machine driving portion, for vertically driving the press head portion 5.

The press body 1 vertically slidably supports a pair of vertical shafts 7, so that the press head portion 5 is mounted to extend across the upper end portions of the vertical shafts 7. The lower ends of the vertical shafts 7 are coupled to a rod 6a of the vertical cylinder 6, serving as a press machine driving portion. The vertical cylinder 6 is driven to vertically move the press head portion 5 in a horizontal state. The lower surfaces of stoppers 8, which are fixed to intermediate portions of the vertical shafts 7, are brought into contact with the upper surfaces of stoppers 9 which are detachably mounted on the upper surface of the body 1, thereby setting the lower limit position of the press head portion 5.

Figure 2:
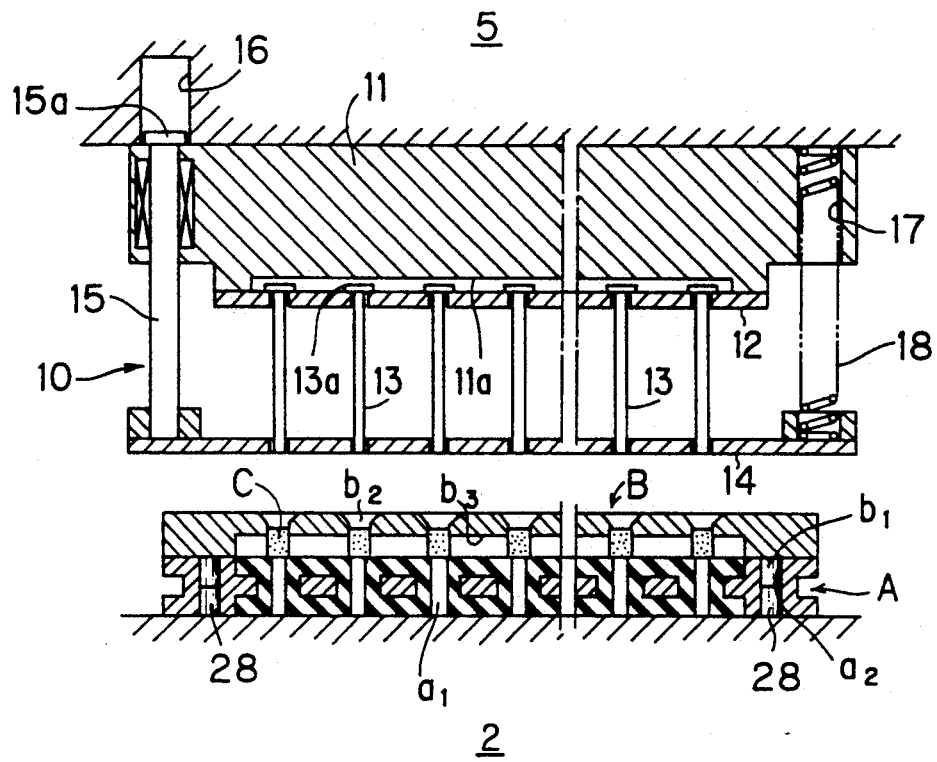
FIG. 2 is a sectional view showing an essential part of the press machine during an operation for inserting chip type electronic components in detail.

FIG. 2 shows the structure of a pin head 10, which is mounted on the central lower surface of the press head portion 5. The pin head 10 comprises a backing plate 11 which is detachably mounted on the lower surface of the press head portion 5, a pin plate 12 which is fixed to the lower side of the backing plate 11, flanged press pins 13 which are slidably inserted in holes of the pin plate 12, and a stripper plate 14 for guiding forward end portions of the press pins 13. The press pins 13 are suspended from the pin plate 12 at flange portions 13a, which are moved up to positions to be in contact with a horizontal surface 11a of the backing plate 11 when reactive press force acts on the press pins 13. Guide shafts 15 are slidably inserted in four corners of the backing plate 11, so that head portions 15a of first ends thereof are inserted in recesses 16 of the press head portion 5 and second ends are fixed to the stripper plate 14. The backing plate 11 is provided on centers of both end portions thereof with spring holes 17 for receiving second ends of springs 18, whose first ends are supported by the stripper plate 14. The stripper plate 14 is downwardly urged by repulsion of the springs 18, and prevented from displacement by the head portions 15a of the guide shafts 15.

FIG. 3 shows a mechanism for moving the table 2. The guide rail 3 is longitudinally set on the upper surface of the body 1, and a slide bearing 26 is mounted on the lower surface of the table 2 to slidably engage with the guide rail 3. The uniaxial unit 4 comprises a ball screw 21 and a guide rail 22, and a slide bearing 23 is mounted on the lower surface of the table 2 to slidably engage with the guide rail 22. A nut 24 is fixed to the slide bearing 23, to be fitted with the ball screw 21. The ball screw 21 is rotated/driven by a stepping motor 25, which is provided on the body 1. When the stepping motor 25 is driven, therefore, it is possible to longitudinally move the table 2 while maintaining the same in a horizontal state, and the position of the table 2 can be arbitrarily set by a pulse signal which is inputted in the stepping motor 25. A pair of set pins 28 are provided on both sides of the upper surface of the table 2 to engage in set holes $a_2$ (see FIG. 2) which are formed on both side portions of the holding plate A, thereby setting the holding plate A on a constant position of the table 2.

As shown in FIG. 3, the table 2 can be stopped in three positions, i.e., a set position, a first working position and a second working position. On the other hand, the pin head 10 is vertically moved in the position shown with oblique lines in FIG. 3. The pin head 10 has a width $W_1$ which is equivalent to the width $W_2$ of the holding plate A, and a depth $S_1$ (along the table moving direction) which is halved as compared with the depth $S_2$ of the holding plate A.

In order to drive the press machine, the table 2 is first moved to the set position so that the holding plate A is set on the table 2, which in turn is retracted to the first working position to press a second half of the holding plate A. Then, the table 2 is retracted to the second working position, to press a first half of the holding plate A. After the two pressing operations are completed, the table 2 is again moved to the set position so that the holding plate A is removed.

Thus, the pressing operations are so divided to reduce a load applied to the holding plate A in a single pressing operation thereby preventing the holding plate A from cracking and deformation, while power for driving the pin head 10 can be reduced to reduce the press machine in size as well as to improve its accuracy. Further, the pin head 10 can be applied to other holding plates having different depths, so far as the pitches of the receiving holes and the widths W are constant. In other words, the pin head 10 can be generally applied to various sizes of holding plates. If the press pins 13 can press the holding plate A twice, the depth $S_2$ of the holding plate A need not be integral times the depth $S_1$ of the pin head 10, but can be arbitrarily changed.

Figure 4:
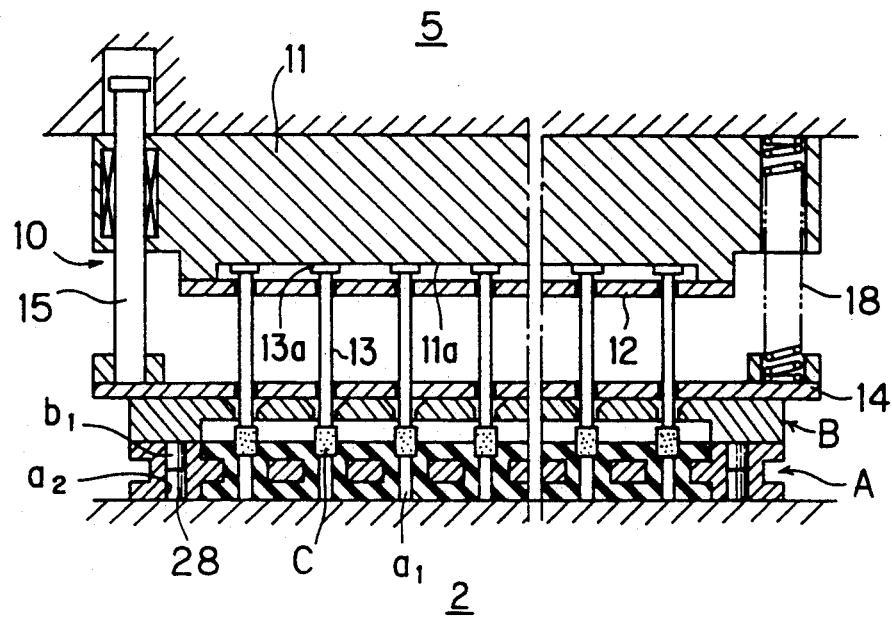
FIG. 4 is a sectional view showing an essential part of the press machine in an intermediate stage of the operation for inserting chip type electronic components in detail.

An operation of the inventive press machine for inserting chip type electronic components into receiving holes of a holding plate is now described with reference to FIGS. 2 and 4.

First, a holding plate A and a guide plate B are set on the table 2, which is located in the set position. At this time, the set pins 28 are inserted in set holes $a_2$ of the holding plate A to set the holding plate A on a prescribed position of the table 2, while pins $b_1$ projected from the lower surface of the guide plate B are inserted in the set holes $a_2$ of the holding plate A in an opposite manner to the set pins 28, thereby registering the guide plate B with the holding plate A. Chip type electronic components C are inserted in through holes $b_2$ of the guide plate B so that lower surfaces of the chip type electronic components C are supported by upper surfaces of receiving holes $a_1$ provided in the holding plate A. The upper end portions of the through holes $b_2$ provided in the guide plate B are tapered. A cavity $b_3$, whose depth is smaller than the lengths of the chip type electronic components C, is formed in the lower surface of the guide plate B. The cavity $b_3$, is adapted to prevent the chip type electronic components C from contact with the guide plate B during its removal. After the holding plate A and the guide plate B are set in the aforementioned manner, the table 2 is slid to one of the working positions, locating the press pins 13 immediately above the through holes $b_2$ of the guide plate B as shown in FIG. 2.

The vertical cylinder 6 downwardly moves the pin head 10, so that the stripper plate 14 comes into pressure contact with the upper surface of the guide plate B to prevent the plates A and B from upward movement. The press pins 13 are then inserted into the through holes $b_2$ of the guide plate B to press the chip type electronic components C into the receiving holes $a_1$ of the holding plate (see FIG. 4). The press pins 13 are slightly retracted with respect to the press head portion 5 when the forward ends thereof strike the chip type electronic components C until the flange portions $13a$ are in contact with the horizontal surface $11a$ of the backing Thereafter, the press pins 13 are pressed by the backing plate 11. When the chip type electronic components C are pressed into prescribed positions, the stoppers 8 come into contact with the stoppers 9, to define the lower limit position of the pin head 10.

Next, the vertical cylinder 6 moves the pin head 10, so that the press pins 13 are upwardly moved by the pin plate 12 and then the stripper plate 14 is separated from the guide plate B.

After such a first pressing operation is completed in the first working position, the table 2 is moved to the second working position, to carry out a second pressing operation. Thereafter the table 2 is returned to the set position, so that the guide plate B and the holding plate A are removed from the table 2. Then the holding plate A is carried to an electrode applicator, so that electrode paste of silver or the like is applied to the projected portions of the chip type electronic components C which are elastically received in the receiving holes $a_1$ of the holding plate A. The electrode paste may be applied to the chip type electronic components C with a roll as disclosed in U.S. Pat. No. 4,395,184, or with a coating plate as disclosed in U.S. Pat. No. 4,664,943.

An operation of the inventive press machine for transferring chip type electronic components from a holding plate to another one is now described with reference to FIGS. 5 and 6.

Figure 5:
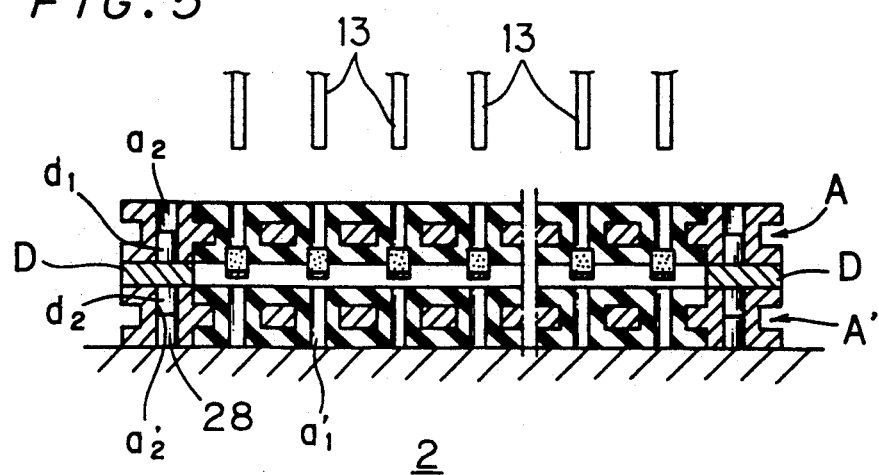
FIG. 5 is an enlarged sectional view of the press machine during an operation for transferring chip type electronic components.

As shown in FIG. 5, a holding plate A' holding no chip type electronic components, a frame type spacer D, and a holding plate A downwardly holding chip type electronic components C, which are provided with electrodes on first ends thereof, are set in an overlapping manner on the table 2, which is located in the set position. The spacer D is provided with pins $d_1$ and $d_2$ for engaging with holes $a_2$ and $a_2'$ of the holding plates A and A', so that the same is correctly registered with the holding plates A and A'. The holes $a_2'$ of the lower holding plate A' is made to receive the set pins 28 of the table 2, which in turn is moved to the first working position.

Figure 6:
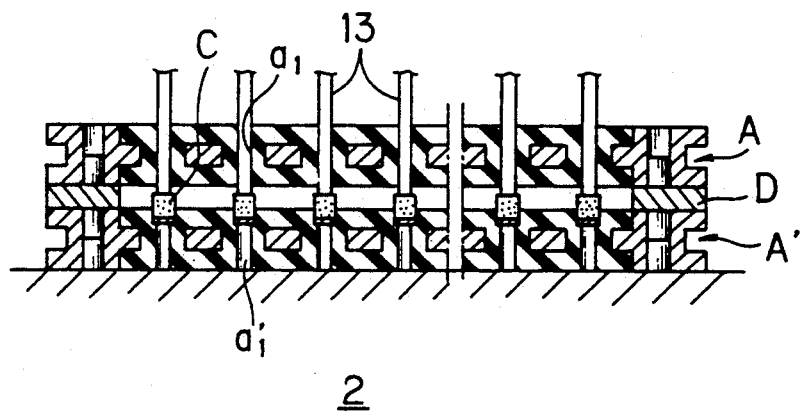
FIG. 6 is an enlarged sectional view of the press machine in an intermediate stage of the operation for transferring chip type electronic components.

In a similar manner to the above, the chip type electronic components C are transferred from the receiving holes $a_1$ of the upper holding plate A to the receiving holes $a_1'$ of the lower holding plate A' by the press pins 13, as shown in FIG. 6. After a first group of the chip type electronic components C are transferred to a first group of the receiving holes $a_1'$ of the holding plate A', the table 2 is moved to the second working position, to transfer the remaining chip type electronic components to the remaining receiving holes $a_1'$ in a similar manner.

The transferred chip type electronic components C are held by the holding plate A' to outwardly project the second ends, which are not yet provided with electrodes. Then, electrode paste is applied to the projected second ends by a prescribed method.

Figure 7:
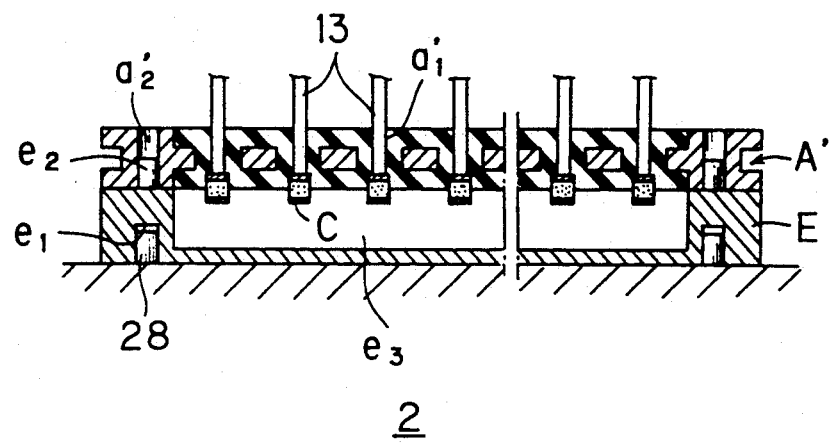
FIG. 7 is an enlarged sectional view of the press machine during an operation for discharging chip type electronic components.

An operation of the inventive press machine for discharging chip type electronic components from a holding plate is now described with reference to FIG. 7.

First, a discharge plate E and a holding plate A' are set in an overlapping manner on the table 2, which is located in the set position. In this case, the set pins 28 of the table 2 are received in holes $e_1$ which are provided in the discharge plate E and pins $e_2$ projected from the upper surface of the discharge plate E are received in holes $a_2'$ which are provided in the holding plate A', whereby the discharge plate E and the holding plate A' are correctly registered on a prescribed position of the table 2.

Then, the table 2 is moved to the first working position, and a first group of the chip type electronic components C received in a first group of the receiving holes $a_1'$ of the holding plate A' are downwardly pressed by the press pins 13 similarly to the inserting or transferring operation, so that the chip type electronic components C drop in a concave portion $e_3$ of the discharge plate E. Thereafter the table 2 is moved to the second working position, to discharge the remaining chip type electronic components C into the discharge plate E. Thus, the chip type electronic components C provided with electrodes on both end portions thereof are collected in the discharge plate E.

Figure 8:
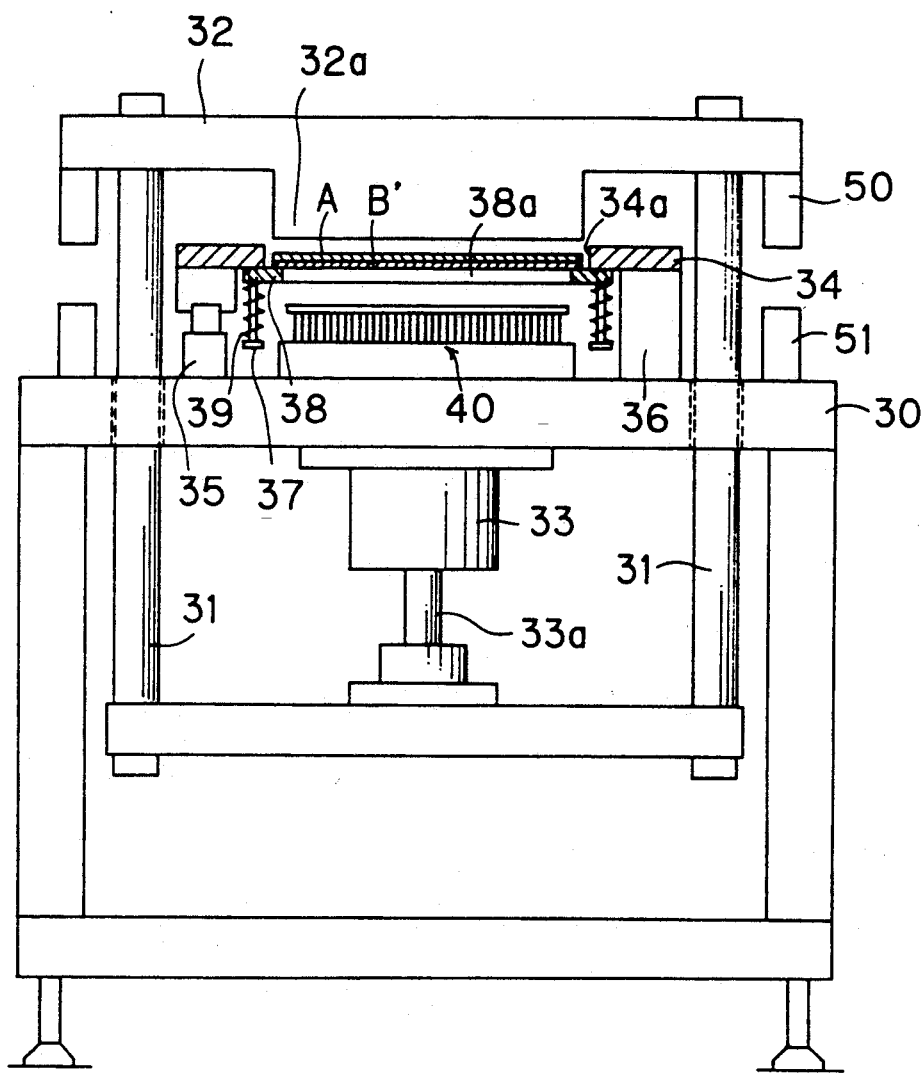
FIG. 8 is a front elevational view showing a press machine according to a second embodiment of the present invention.

FIG. 8 shows a second embodiment of the inventive press machine.

According to this embodiment, a press body 30 comprises a vertically slidable pair of vertical shafts 31, and a pressing member 32 is provided to extend across the upper end portions of the vertical shafts 31. A protrusion $32a$ is integrally provided on the central lower surface of the pressing member 32. The lower end portions of the vertical shafts 31 are coupled to a rod $33a$ of a vertical cylinder 33, which is driven to vertically move the pressing member 32 in a horizontal state.

A frame type table 34 is supported on the press body 30 by a guide rail 35 and a uniaxial unit 36 to be movable in a horizontal direction (direction perpendicular to the plane of FIG. 8). A central opening $34a$ of the table 34 is slightly larger than the protrusion $32a$. A support frame 38, which is vertically movably supported on the lower surface of the table 34 through a plurality of support shafts 37, is regularly upwardly urged by springs 39 provided on the support shafts 37, to be in contact with the lower surface of the table 34. The support frame 38 has a central opening $38a$, which is slightly smaller than the outlines of a guide plate B' and a holding plate A and slightly larger than the outline of a pin head 40 as described below.

Figure 9:
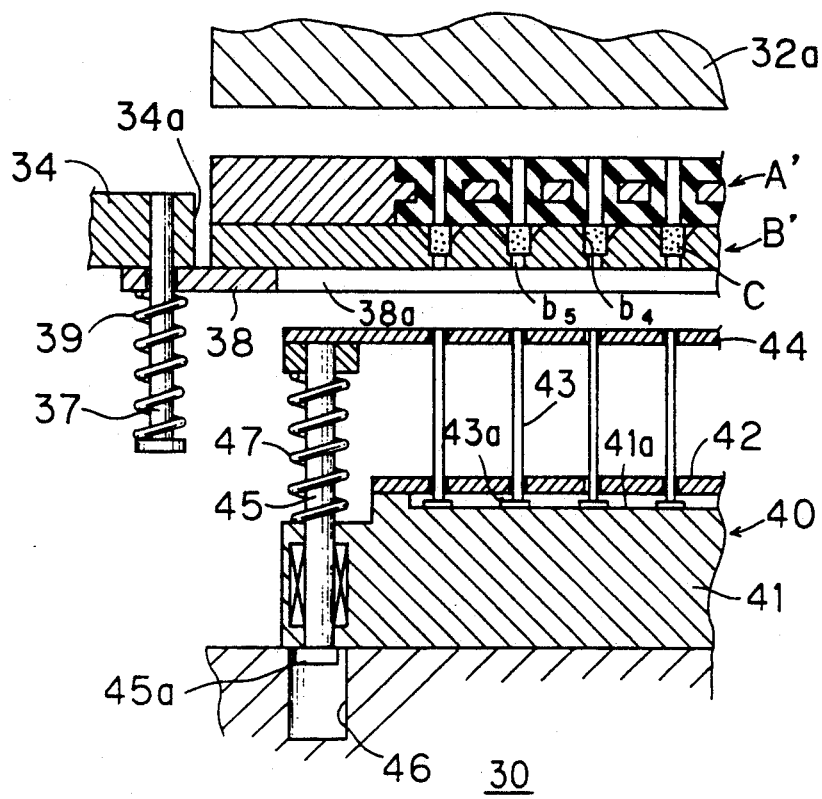
FIG. 9 is a sectional view showing an essential part of the press machine shown in FIG. 8 during an operation for inserting chip type electronic components in detail.

The pin head 40 is horizontally provided on the upper surface of the press body 30. As shown in FIG. 9, this pin head 40 comprises a backing plate 41 which is detachably mounted on the upper surface of the press body 30, a pin plate 42 which is fixed to the upper side of the backing plate 41, press pins 43 having flange portions $43a$, which are slidably inserted in holes of the pin plate 42, and a stripper plate 44 for guiding forward end portions of the press pins 43. The flange portions $43a$ of the press pins 43 are prevented from displacement by the pin plate 42, to be regularly in contact with a horizontal surface $41a$ of the backing plate 41. Guide shafts 45 are slidably inserted in four corners of the backing plate 41, so that head portions $45a$ of the lower ends thereof are inserted in recesses 46 of the press body 30 and the other ends are fixed to the stripper plate 44. The guide shafts 45 are provided with springs 47, so that the stripper plate 44 is upwardly urged by repulsion of the springs 47 and prevented from displacement by the head portions 45a of the guide shafts 45.

The holding plate A is absolutely similar in structure to the holding plate A (see FIG. 2) employed in the first embodiment, while the guide plate B' is also similar to the guide plate B employed in the first embodiment, except that the same is provided with receiving holes $b_4$, having bottoms, in place of the through holes $b_2$; and small holes $b_5$, which can receive the press pins 43, in place of the cavities $b_3$.

Figure 10:
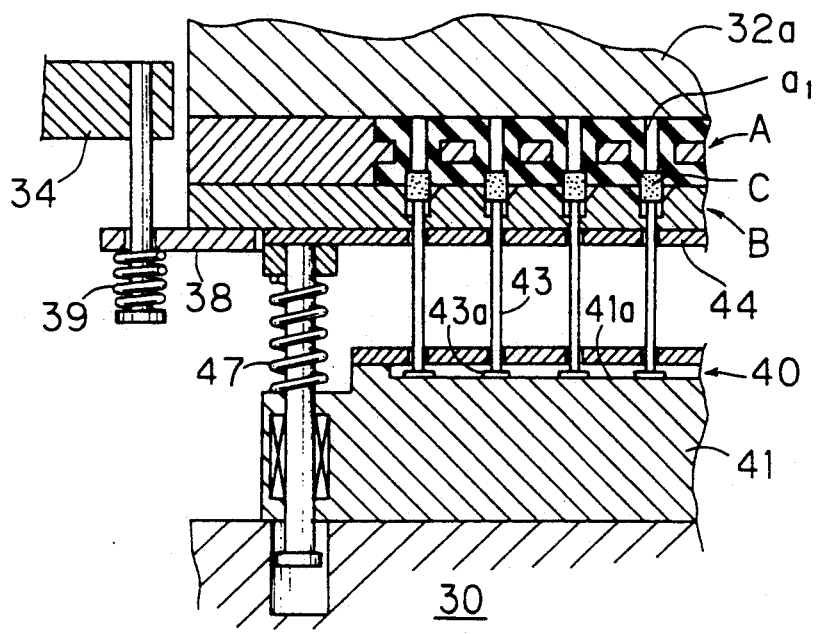
FIG. 10 is a sectional view showing the press machine of FIG. 8 in an intermediate stage of the operation for inserting chip type electronic components.

An operation for inserting chip type electronic components C in receiving holes $a_1$ of the holding plate A with the aforementioned press machine is now described with reference to FIGS. 9 and 10.

First, the guide plate B' and the holding plate A are set on the support frame 38 of the table 34, which is in a set position, in an overlapping manner. At this time, the plates B' and A are held in a constant position by means similar to that employed in the embodiment shown in FIG. 2. The chip type electronic components C are held in the receiving holes $b_4$ of the guide plate B'. After the holding plate A and the guide plate B' are set on the support frame 38, the table 34 is slid to a first working position, so that the press pins 43 are located immediately under the small holes $b_5$ of the guide plate B', as shown in FIG. 9.

The pressing member 32 is downwardly moved by the vertical cylinder 33, so that the protrusion 32a of the pressing member 32 strikes the upper surface of the holding plate A, to integrally press down the holding plate A, the guide plate B' and the support frame 38. When the lower surface of the guide plate B' comes into pressure contact with the upper surface of the stripper plate 44, the press pins 43 enter the receiving holes $b_4$ of the guide plate B' through the small holes $b_5$, to press the chip type electronic components C into the receiving holes $a_1$ of the holding plate A (see FIG. 10). Since the flange portions 43a of the press pins 43 are supported by the horizontal surface 41a of the backing plate 41, the chip type electronic components C are pressed into prescribed positions along the downward movement of the pressing member 32. Finally, stoppers 50 provided on the pressing member 32 come into contact with stoppers 51 (see FIG. 8) provided on the upper surface of the press body 30, to define the lower limit position of the pressing member 32.

Thereafter the pressing member 32 is upwardly moved by the vertical cylinder 33, so that the support frame 38, the plates A and B' and the stripper plate 44 are integrally moved up by repulsion of the springs 39 and 47. After the press pins 43 are discharged from the guide plate B', the stripper plate 44 is separated from the guide plate B'. Then the support frame 38 comes into contact with the table 34, and the protrusion 32a is separated from the holding plate A, as shown in FIG. 9.

After such a first pressing operation is completed in the first working position, the table 34 is moved to a second working position, to carry out a second pressing operation. Thereafter the table 34 is returned to the set position, so that the guide plate B' and the holding plate A are removed from the table 34. The holding plate A is then carried to an electrode applicator.

According to the second embodiment, the upper ends of the receiving holes $b_4$ of the guide plate B' are inwardly tapered to serve as recesses for facilitating removal of the holding plate A holding the chip type electronic components C from the guide plate B'. Therefore, the guide plate B' may not be provided with the cavities $b_3$ dissimilarly to the first embodiment, and the chip type electronic components C are hardly inclined when the same are inserted in the receiving holes $a_1$. Thus, the chip type electronic components C can be efficiently inserted into the receiving holes $a_1$.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of pressing chip type electronic components using a press machine comprising a horizontally supported holding plate provided with a number of receiving holes having a predetermined arrangement and a horizontally supported pin head having a number of press pins having the same arrangement as said receiving holes for carrying out at least one of the following operations: inserting a chip type electronic component into receiving holes of a holding plate; transferring chip type electronic components from one holding plate to another; and pressing out chip type electronic components from receiving holes of a holding plate, said method comprising the steps of:

preparing said press machine with said pin head having a portion provided with said press pins, said portion being smaller than a portion of said holding plate provided with said receiving holes; and relatively moving said holding plate and said pin head in the horizontal direction by a plurality of prescribed distances, and relatively moving said holding plate and said pin head in the vertical direction for each of said relative horizontal movements by prescribed distances, thereby engaging said pin head with a single said holding plate a plurality of times and at different respective locations on said single holding plate.

2. A method of pressing chip type electronic components in accordance with claim 1, wherein said portion provided with said receiving holes is in the form of a rectangle and said portion provided with said press pins is also in the form of a rectangle having a width identical to that of said portion provided with said receiving holes, and a depth smaller than that of said portion provided with said receiving holes.

3. A chip pressing apparatus for carrying out at least one of the following operation: inserting chip type electronic components into receiving holes of a holding plate; transferring chip type electronic components from one holding plate to another; or pressing out chip type electronic components from receiving holes of a holding plate, said chip pressing apparatus comprising:

a holding plate having a number of receiving holes in a predetermined arrangement;

a pin head having a number of press pins having a predetermined arrangement corresponding to said predetermined arrangement of said receiving holes, said number of said press pins being less than said number of said receiving holes;

first means for changing and maintaining a horizontal relationship of said holding plate and said pin head;

second means for changing the vertical relationship of said holding plate and said pin head.

4. A chip pressing apparatus according to claim 3, wherein said second means is capable of changing said vertical relationship each time said first means changes said horizontal relationship.

5. A chip pressing apparatus according to claim 3, wherein said number of said receiving holes is an integral multiple of said number of said press pins.

6. A chip pressing apparatus according to claim 3, wherein said number of said receiving holes is a non-integral multiple of said number of said press pins.

7. A chip pressing apparatus according to claim 3, wherein the area of said predetermined arrangement of said receiving holes is an integral multiple of the area of said predetermined arrangement of said press pins.

8. A chip pressing apparatus according to claim 3, wherein the area of said predetermined arrangement of said receiving holes is a non-integral multiple of the area of said predetermined arrangement of said press pins.

* * * * *